United States Patent
Wert

(10) Patent No.: US 7,042,264 B1
(45) Date of Patent: May 9, 2006

(54) VARIABLE DRIVE STRENGTH HYSTERESIS INPUT CIRCUITRY

(75) Inventor: Joseph Douglas Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 41 days.

(21) Appl. No.: 10/839,543

(22) Filed: May 5, 2004

(51) Int. Cl.
*H03K 3/356* (2006.01)

(52) U.S. Cl. ...................... 327/206; 327/205

(58) Field of Classification Search ............... 327/205, 327/206, 111, 112; 326/21, 26
See application file for complete search history.

(56) References Cited

U.S. PATENT DOCUMENTS

| | | | | |
|---|---|---|---|---|
| 5,767,728 A | * | 6/1998 | Michail et al. | 327/374 |
| 6,046,617 A | * | 4/2000 | Hoeld | 327/206 |
| 6,388,488 B1 | * | 5/2002 | Ho | 327/206 |
| 2005/0093602 A1 | * | 5/2005 | Hinterscher | 327/205 |

* cited by examiner

Primary Examiner—Vibol Tan

(57) ABSTRACT

A variable drive strength hysteresis input circuit is disclosed that comprises pull-up circuitry and pull-down circuitry. A variable drive strength circuit changes the pull-up drive strength and the pull-down drive strength in response to receiving an input voltage signal that transitions either from a low level to a high level or from a high level to a low level. In one advantageous embodiment the variable drive strength hysteresis input circuit comprises four p-channel MOSFET transistors and four n-channel MOSFET transistors. The invention efficiently reduces transition noise in the inputs to an integrated circuit chip.

19 Claims, 3 Drawing Sheets

VARIABLE DRIVE STRENGTH HYSTERESIS INPUT CIRCUITRY

TECHNICAL FIELD OF THE INVENTION

The present invention is generally directed to manufacturing technology for semiconductor devices and, in particular, to efficient circuitry for providing variable drive strength hysteresis for reducing transition noise in the inputs to an integrated circuit chip.

BACKGROUND OF THE INVENTION

The application of hysteresis to the inputs of an integrated circuit chip is commonly used to provide transition noise immunity to a system. Prior art CMOS inputs typically have (1) a first trip point for which a value of voltage of an input voltage signal above the value of the first trip point causes a corresponding output voltage signal to transition from a "low" level to a "high" level and (2) a second trip point for which a value of voltage of an input voltage signal below the value of the second trip point causes a corresponding output voltage signal to transition from a "high" level to a "low" level.

This means that for a standard prior art CMOS input, if the input voltage is noisy (or if the power and ground on the input of the chip are noisy) the input may be seen to transition more than once as it goes from a "high" level to a low "level" or from a "low" level to a "high" level. These transitions are referred to as transition noise.

It is well known that a hysteresis circuit may be used counteract the effects of transition noise. FIG. 1 illustrates an exemplary plot 100 of an input voltage signal 110 and an output voltage signal 120 of a prior art hysteresis circuit over time (where the time is measured in nanoseconds). The input voltage signal 110 rises from a value of zero volts (0.0 volts) at time zero (On) to a value of three volts (3.0 volts) at two hundred nanoseconds (200 n). The input voltage signal 110 then drops from a value of three volts (3.0 volts) at two hundred nanoseconds (200 n) to a value of zero volts (0.0 volts) at four hundred nanoseconds (400 n).

In response the output signal voltage 120 rises from a value of zero volts (0.0 volts) to three volts (3.0 volts) at approximately one hundred twenty five nanoseconds (125 n). The output signal voltage 120 then remains at three volts (3.0 volts) until approximately three hundred fifteen nanoseconds (315 n). At that point the value of output signal voltage 120 drops to a value of zero volts (0.0 volts).

The first trip point for input signal voltage 110 that causes a transition of output voltage signal 120 from a "low" level to a "high" level occurs at voltage level $V_A$. That is, when the input voltage signal 110 is rising then the input voltage signal 110 must reach the value of voltage $V_A$ in order to trigger a transition of output voltage signal 120 from a "low" level to a "high" level.

The second trip point for input signal voltage 110 that causes a transition of output voltage signal 120 from a "high" level to a "low" level occurs at voltage level $V_B$. That is, when the input voltage signal 110 is falling then the input voltage signal 110 must reach the value of voltage $V_B$ in order to trigger a transition of output voltage signal 120 from a "high" level to a "low" level.

The actual values of voltage $V_A$ and of voltage $V_B$ may be varied by adjusting the hysteresis input circuit. The voltage range between voltage $V_A$ and voltage $V_B$ is referred to as the "dead zone". The amount of hysteresis is the voltage difference $V_A$–$V_B$. In the "dead zone" changes in the value of input voltage signal 110 do not affect the value of output voltage signal 120.

For example, as previously mentioned, if input voltage signal 110 is rising it must reach the voltage value $V_A$ in order to trigger a transition of output voltage signal 120 from a "low" level to a "high" level. After the transition of output signal voltage 120 from "low" to "high" has occurred, if there is noise on the input voltage signal 110 then the noise on input voltage signal 110 must be equal to or greater than the amount of hysteresis $V_A$–$V_B$ before the output signal voltage 120 would change from its "high" level to a "low" level. That is, the addition of noise to the input voltage signal 110 would have to cause input voltage signal 110 to fall below the voltage level $V_B$. This means that the noise immunity is given by the voltage difference $V_A$–VB.

Similarly, if input voltage signal 110 is falling it must reach the voltage value $V_B$ in order to trigger a transition of output voltage signal 120 from a "high" level to a "low" level. After the transition of output signal voltage 120 from "high" to "low" has occurred, if there is noise on the input voltage signal 110 then the noise on input voltage signal 110 must be equal to or greater than the amount of hysteresis $V_A$–$V_B$ before the output signal voltage 120 would change from its "low" level to a "high" level. That is, the addition of noise to the input signal voltage 110 would have to cause input signal voltage 110 to rise above the voltage level $V_A$. Once again, the noise immunity is the voltage difference $V_A$–$V_B$.

FIG. 2 illustrates an exemplary prior art hysteresis input circuit 200. Prior art hysteresis circuits typically work by using contention between the power voltage (VDD) and the ground voltage (VSS). Although the contention method may be easily used to implement hysteresis, the contention between the power voltage (VDD) and the ground voltage (VSS) is wasteful of current. Further, in integrated circuit chips that have large numbers of inputs the contention method may contribute to glitching of the power level and the ground level inside the integrated circuit chip.

Prior art hysteresis input circuit 200 illustrated in FIG. 2 comprises six metal oxide semiconductor field effect transistors (MOSFET). Transistor 210 (designated P1), transistor 220 (designated P2) and transistor 230 (designated P3) each comprise a p-channel transistor. Transistor 240 (designated N1), transistor 250 (designated N2) and transistor 260 (designated N3) each comprise an n-channel transistor.

The input signal (designated PAD_IN) to hysteresis input circuit 200 is applied to the gate of each of the transistors 210 (P1), 220 (P2), 240 (N1) and 250 (N2). As shown in FIG. 2 node INZ is located between transistor 220 (P2) and transistor 240 (N1). The gate of transistor 230 (P3) is coupled to node INZ. The gate of transistor 260 (N3) is also coupled to the node INZ.

Consider the operation of hysteresis input circuit 200 when the input signal voltage PAD_IN transitions from "low" to "high". The value of the input signal voltage PAD_IN is initially zero and the value of voltage at node INZ is equal to the power voltage VDD. When this occurs then transistor 260 (N3) is completely on. As the value of input signal voltage PAD_IN rises the value of voltage will eventually reach the threshold voltage value Vth. A typical value of Vth is in the range from five tenths volt (0.5 volt) to nine tenths volt (0.9 volt).

When the value of the PAD_IN input signal reaches the value of the threshold voltage Vth, then transistor 240 (N1) and transistor 250 (N2) begin to turn on. Transistor 250 (N2) sinks the current that is provided by transistor 260 (N3), thereby hampering the ability of transistor 260 (N3) to pull down node INZ. As the value of the PAD_IN input signal continues to rise, at some point transistor 250 (N2) is able to overcome the current that is provided by transistor 260 (N3), and voltage value at node INZ begins to drop. As the voltage value at node INZ drops, transistor 260 (N3) is debiased (that is, the gate to source voltage Vgs of transistor 260 (N3) decreases) until transistor 240 (N1) and transistor 250 (N2) are able to pull the value of voltage at node INZ to ground, at which time transistor 260 (N3) is fully off. During this transition transistor 260 (N3) and transistor 250 (N2) are sinking current from VDD to ground VSS.

Now consider the operation of hysteresis input circuit 200 when the input signal voltage PAD_IN transitions from "high" to "low". The value of the input signal voltage PAD_IN is initially equal to the power voltage VDD and the value of voltage at node INZ is equal to the ground voltage VSS. When this occurs then transistor 230 (P3) is completely on. As the value of the input signal voltage PAD_IN decreases the value of PAD_IN will eventually reach a value of voltage for which the sum of PAD_IN and the threshold voltage Vth will be approximately equal to the power voltage VDD. When this occurs (i.e., when PAD_IN+1 Vth≅VDD), transistor 210 (P1) will be turned on. At this time transistor 230 (P3) will be fully on, so the current flow from transistor 210 (P1) will be sunk to ground rather than causing node INZ to transition to a high. As PAD_IN input signal continues to decrease in value, the gate to source voltage Vgs across transistor 210 (P1) increases until transistor 210 (P1) overpowers transistor 230 (P3), and the voltage level at node INZ begins to rise. As the voltage level at node INZ begins to rise, transistor 230 (P3) becomes debiased, and transistor 210 (P1) and transistor 220 (P2) drive the voltage at node INZ to the VDD voltage level. The action of hysteresis input circuit 200 is based upon sinking current from VDD to ground VSS.

The function that is performed by hysteresis input circuit 200 may also be performed using other types of circuits. For example, it would be possible to operate hysteresis input circuit 200 even if transistor 230 (P3) or transistor 260 (N3) (but not both) were deleted.

The prior art approach discussed above is inefficient because it generates significant levels of transient response current. The contention between the power voltage (VDD) and the ground voltage (VSS) wastes current. Therefore, there is a need in the art for a more efficient system and method for providing hysteresis for reducing transition noise in the inputs to an integrated circuit chip.

SUMMARY OF THE INVENTION

To address the above-discussed deficiencies of the prior art, it is a primary object of the present invention to provide a variable drive strength hysteresis input circuit for efficiently reducing transition noise in the inputs to an integrated circuit chip.

In one advantageous embodiment of the present invention the variable drive strength hysteresis input circuit comprises eight metal oxide semiconductor field effect transistors (MOSFET). Four of the transistors are p-channel transistors and four of the transistors are n-channel transistors. The eight transistors are coupled together as shown in FIG. 3 of the drawings. An input signal (designated PAD_IN) is applied to the gate of transistor P2 and to the gate of transistor N1. Transistor P2 and transistor N1 are coupled together in an inverter configuration. Therefore the signal that appears at the node INZ is the inverse of the input signal PAD_IN.

The signal at the node INZ is applied to the gate of transistor P4 and to the gate of transistor N4. Transistor P4 and transistor N4 are coupled together in an inverter configuration. Therefore the signal that appears at the feedback node FB is the inverse of the signal that appears at node INZ.

When the input signal PAD_IN transitions from "low" to "high" the value of the voltage at node INZ is equal to the power voltage VDD. As the value of the input signal voltage PAD_IN rises the value of the voltage at the feedback node FB tracks the value of the input signal voltage PAD_IN. This means that transistor P3 is on and transistor N3 is off.

As the input signal voltage PAD_IN continues to rise eventually transistor P2 begins to be overcome by transistors N1 and N2. When this happens the value of the voltage at node INZ begins to drop and at some point the inverter configuration of transistor P4 and transistor N4 switches. The switch of the INZ node from "high" to "low" will occur before the input signal voltage PAD_In reaches its "high" value (i.e., VDD). The switch of the inverter configuration of transistor P4 and transistor N4 causes the voltage value at the feedback node FB to go "high". This causes transistor P3 to turn off and transistor N3 to turn on.

During a transition of the input signal voltage PAD_IN from "low" to "high" (1) the drive strength of the pull-up circuitry is strong because it is driven by the P2 and P1/P3 combination, and (2) the drive strength of the pull-down circuitry is weak because it is driven by the relatively weak N1/N2 combination.

The present invention operates in a similar manner when the input signal voltage PAD_IN transitions from "high" to "low". During a transition of the input signal voltage PAD_IN from "high" to "low" (1) the drive strength of the pull-up circuitry is weak because it is driven by the relatively weak P2/P1 combination, and (2) the drive strength of the pull-down circuitry is strong the because it is driven by the N1 and N2/N3 combination.

Because there is minimal contention between the power voltage VDD and the ground voltage VSS in the present invention there is minimal wasted current.

It is an object of the present invention to provide a variable drive strength hysteresis input circuit.

It is also an object of the present invention to provide a variable drive strength hysteresis input circuit that efficiently reduces transition noise in the inputs to an integrated circuit chip.

It is yet another object of the present invention to provide a variable drive strength hysteresis input circuit that changes the relative drive strengths between pull-up circuitry and pull-down circuitry.

It is still another object of the present invention to provide a variable drive strength hysteresis input circuit that is capable of generating a feedback signal that changes the drive strength of pull-up circuitry and that changes the drive strength of pull-down circuitry.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
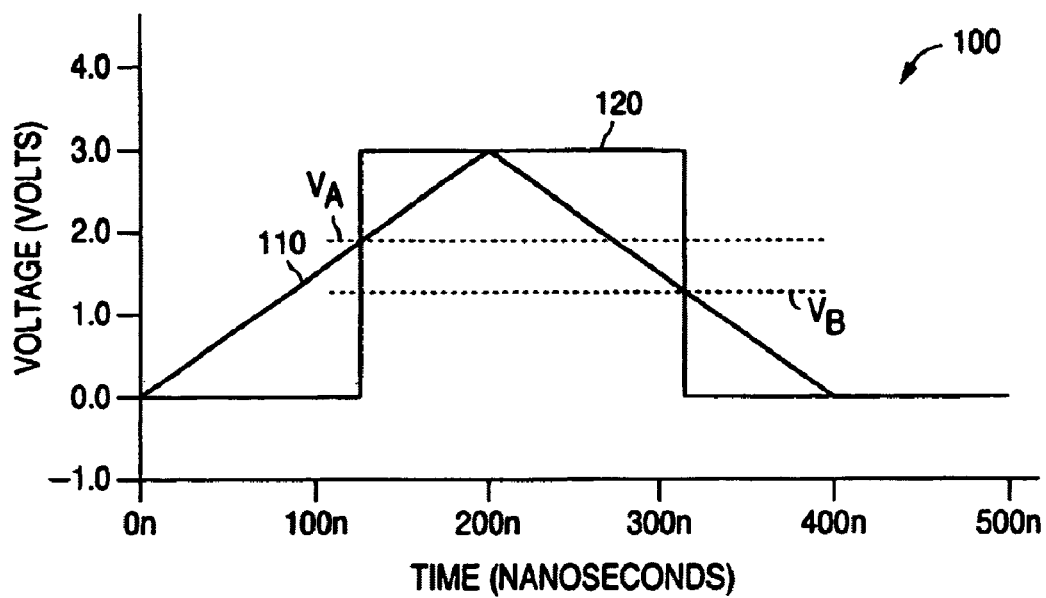
FIG. 1 illustrates an exemplary plot over time of an input voltage signal and an output voltage signal of a prior art hysteresis input circuit.
Figure 2:
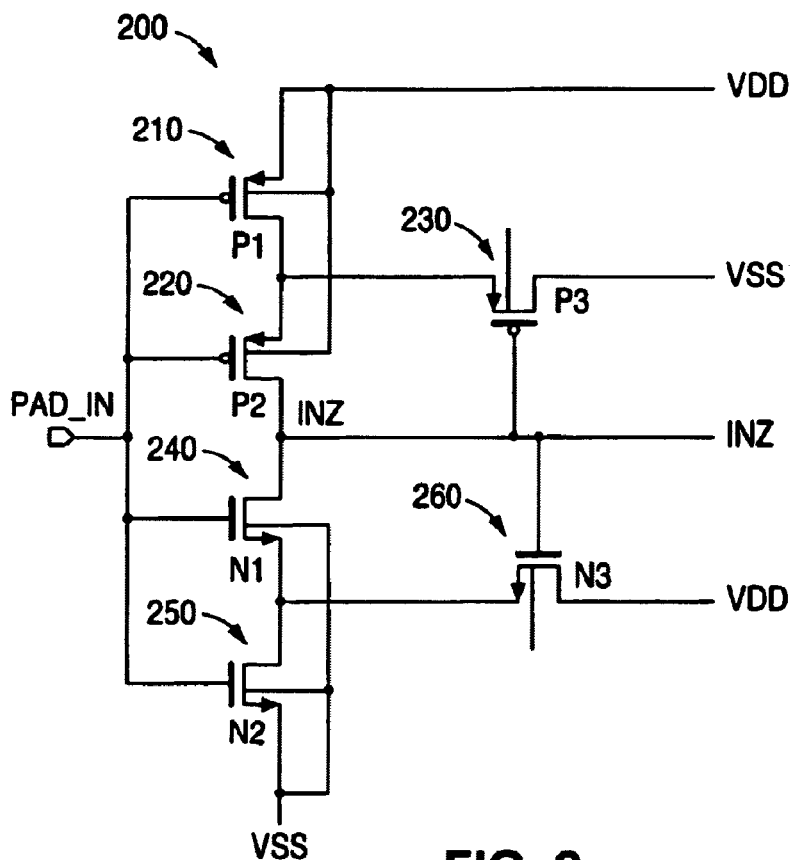
FIG. 2 illustrates an exemplary prior art hysteresis input circuit.
Figure 3:
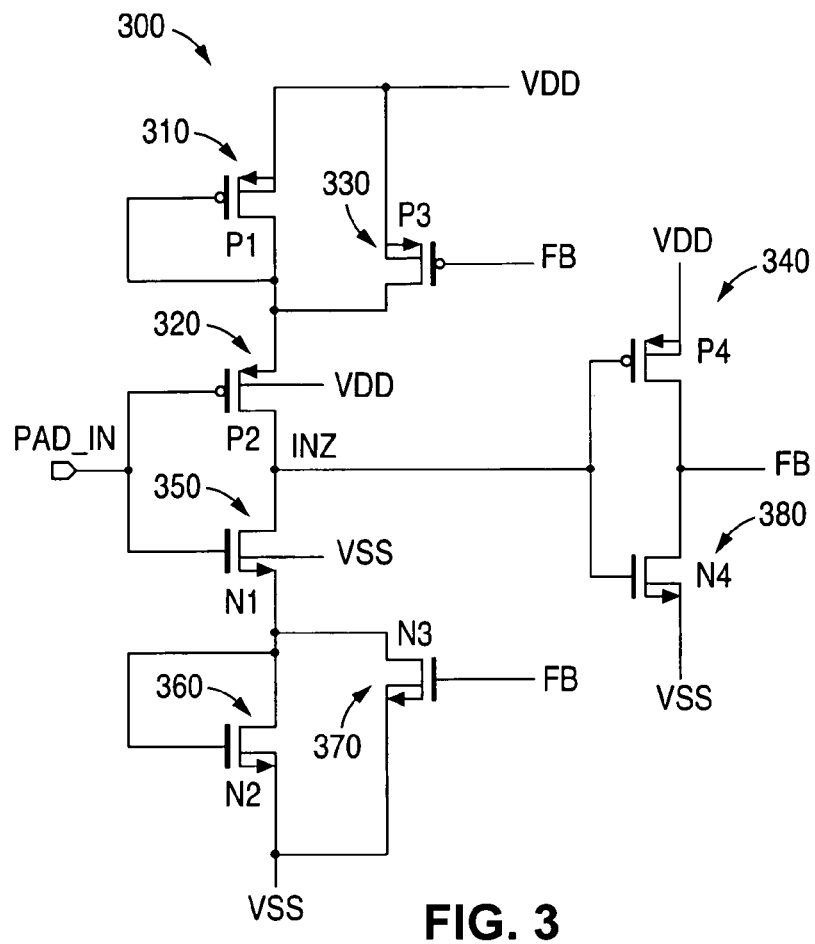
FIG. 3 illustrates an advantageous embodiment of a hysteresis input circuit constructed in accordance with the principles of the present invention.
Figure 4:
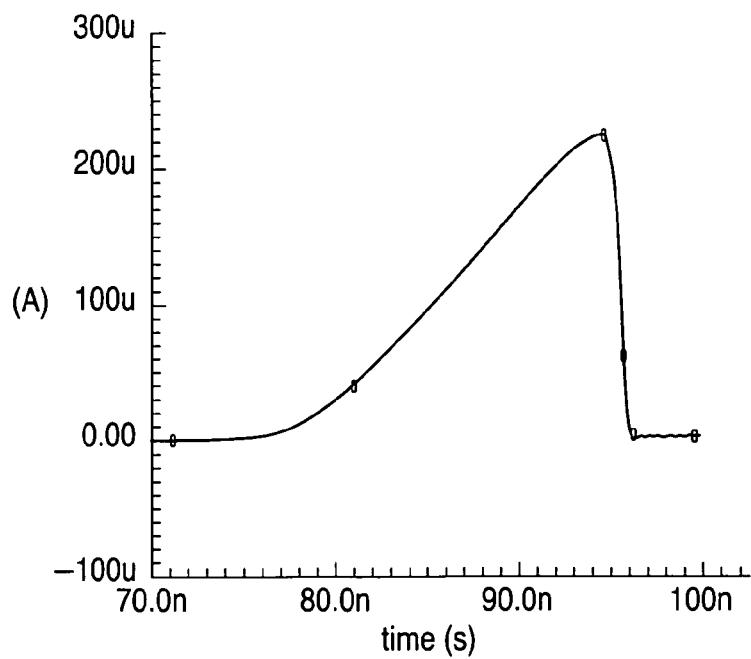
FIG. 4 illustrates an exemplary plot over time of a transient response of a current signal of a prior art hysteresis input circuit.
Figure 5:
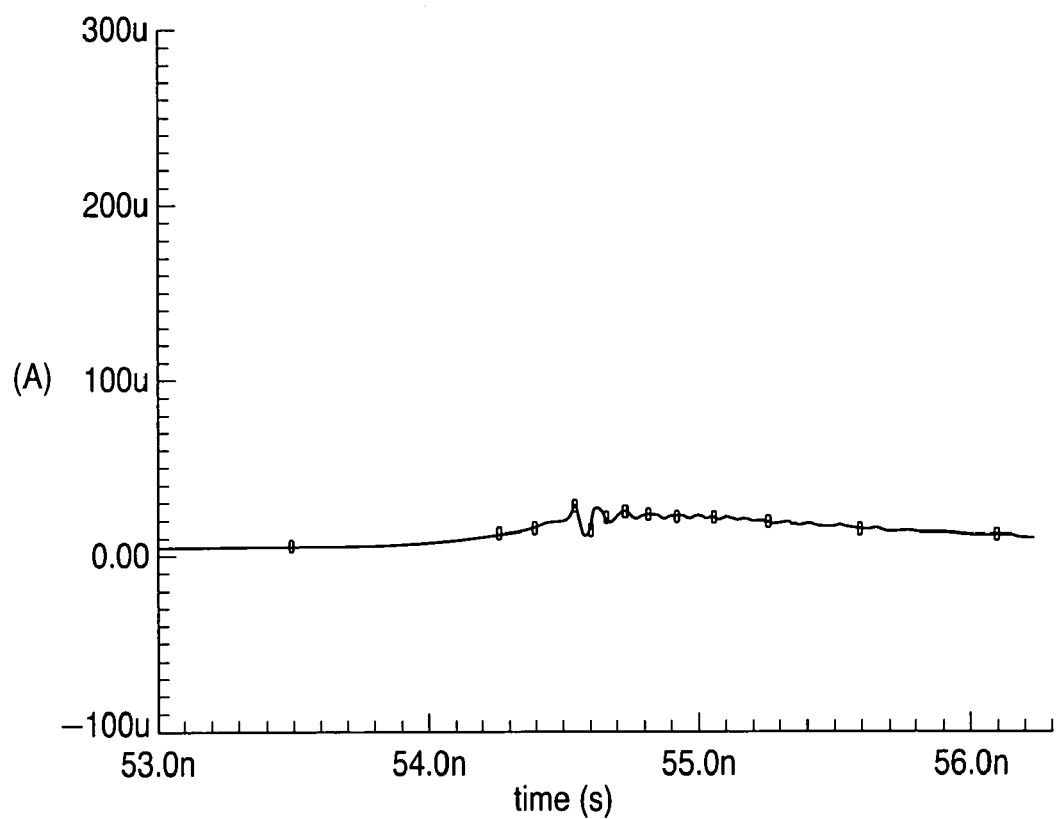
FIG. 5 illustrates an exemplary plot over time of a transient response of a current signal of an advantageous embodiment of a hysteresis input circuit constructed in accordance with the principles of the present invention.

FIGS. 3 through 5, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged hysteresis input circuit.

FIG. 3 illustrates an advantageous embodiment of a hysteresis input circuit 300 constructed in accordance with the principles of the present invention. The approach of the present invention is not based upon contention between the power voltage VDD and the ground voltage VSS. In the present invention there is minimal contention between the power voltage VDD and the ground voltage VSS. The approach of the present invention is based upon changing the relative drive strengths between the pull-up circuitry and the pull-down circuitry that drive node INZ.

Hysteresis input circuit 300 illustrated in FIG. 3 comprises eight metal oxide semiconductor field effect transistors (MOSFET). Transistor 310 (designated P1), transistor 320 (designated P2), transistor 330 (designated P3) and transistor 340 (designated P4) each comprise a p-channel transistor. Transistor 350 (designated N1), transistor 360 (designated N2), transistor 370 (designated N3) and transistor 380 (designated N4) each comprise an n-channel transistor.

The input signal (designated PAD_IN) to hysteresis input circuit 300 is applied to the gate of transistor 320 (P2) and to the gate of transistor 350 (N1). As shown in FIG. 3 node INZ is located between transistor 320 (P2) and transistor 350 (N1). Transistor 330 (P3) is in parallel with transistor 310 (P1). Transistor 370 (N3) is in parallel with transistor 360 (N2). Transistor 340 (P4) and transistor 380 (N4) are coupled together in an inverter configuration. The voltage at node INZ is provided as an input to the gate of transistor 340 (P4) and to the gate of transistor 380 (N4). The output voltage of the inverter configuration of transistor 340 (P4) and transistor 380 (N4) appears at node FB.

Consider the operation of hysteresis input circuit 300 when the input signal voltage PAD_IN transitions from "low" to "high". The value of the input signal voltage PAD_IN is initially zero and the value of voltage at node INZ is equal to the power voltage VDD. As the value of input signal voltage PAD_IN rises the value of voltage at node FB tracks the value of voltage at PAD_IN. So the voltage value at node FB is initially low. This means that transistor 330 (P3) is on and transistor 370 (N3) is off. So the relative pull-up strength driving node INZ is high, while the pull-down strength is provided only by transistor 350 (N1) and transistor 360 (N2).

Transistor 360 (N2) is relatively weak in that its maximum gate to source voltage is approximately equal to the threshold voltage Vth (i.e., Vgs≅Vth). As the input signal voltage PAD_IN continues to rise, eventually transistor 320 (P2) begins to be overcome by the pair of transistors 350 (N1) and 360 (N2). As this happens, the value of the voltage at node INZ begins to drop and at some point the inverter configuration of transistor 340 (P4) and transistor 380 (N4) switches. The switch of the INZ node from "high" to "low" will occur before the input signal voltage PAD_In reaches its "high" value (i.e., VDD). The switch of the inverter configuration of transistor P4 and transistor N4 causes the voltage value at the feedback node FB to go "high". This causes transistor 330 (P3) to be turned off and transistor 370 (N3) to be turned on, completing the switch. At this point, (1) the value of input signal voltage PAD_IN is equal to the power voltage VDD (i.e., PAD_IN=VDD), (2) the value of voltage at node INZ is equal to the ground voltage VSS (i.e., INZ=VSS), and (3) the value of voltage at node FB is equal to the power voltage VDD (i.e., FB=VDD).

During a transition of the input signal voltage PAD_IN from "low" to "high" (1) the drive strength of the pull-up circuitry is strong because it is driven by the P2 and P1/P3 combination, and (2) the drive strength of the pull-down circuitry is weak because it is driven by the relatively weak N1/N2 combination.

Now consider the operation of hysteresis input circuit 300 when the input signal voltage PAD_IN transitions from "high" to "low". The value of the input signal voltage PAD_IN is initially equal to the power voltage VDD and the value of voltage at node INZ is equal to the ground voltage VSS. As the value of input signal voltage PAD_IN decreases, the combination of transistor 310 (P1) and transistor 320 (P2) becomes stronger and transistor 350 (N1) becomes weaker. This means that the pull-down strength is high and the pull-up strength is low.

As the value input signal voltage PAD_IN continues to decrease, then eventually the combination of transistor 310 (P1) and transistor 320 (P2) will begin to overcome the combination of transistor 350 (N1), transistor 360 (N2) and transistor 370 (N3) and the value of voltage at node INZ will begin to increase.

When the voltage at node INZ increases sufficiently the inverter configuration of transistor 340 (P4) and transistor 380 (N4) switches. The switch of the INZ node from "low" to "high" will occur before the input signal voltage PAD_In reaches its "low" value (i.e., VSS). The switch of the inverter configuration of transistor P4 and transistor N4 causes the voltage value at the feedback node FB to go "low". When the voltage level at node FB goes "low" it turns off transistor 370 (N3) and turns on transistor 330 (P3). When this happens (1) the value of input signal voltage PAD_IN becomes equal to the ground voltage VSS (i.e., PAD_IN=VSS), (2) the value of voltage at node INZ becomes equal to the power voltage VDD (i.e., INZ=VDD), and (3) the value of voltage at node FB becomes equal to the ground voltage VSS (i.e., FB=VSS).

During a transition of the input signal voltage PAD_IN from "high" to "low" (1) the drive strength of the pull-up circuitry is weak because it is driven by the relatively weak P2/P1 combination, and (2) the drive strength of the pull-down circuitry is strong the because it is driven by the N1 and N2/N3 combination.

The following table sets forth the possibilities.

| INPUT | Pull-up circuitry | Pull-down circuitry | INZ Node | FB Node |
| --- | --- | --- | --- | --- |
| Low | P2 & P1/P3 (strong) | N1 & N2 (weak) | High | Low |
| Low to High | P2 & P1/P3 (strong) | N1 & N2 (weak) | High | Low |
| High | P2 & P1 (weak) | N1 & N2/N3 (strong) | Low | High |
| High to Low | P2 & P1 (weak) | N1 & N2/N3 (strong) | Low | High |

The method of operation of hysteresis input circuit 300 involves modifying the drive strengths between the pull-up circuitry and the pull-down circuitry that drive node INZ based on the transitions of the input voltage PAD_IN. The method of operation of hysteresis input circuit 300 expends much less current than prior art hysteresis input circuits.

The variable drive strength is set by the previous state of the input. The existing state is always strongly driven while the next state is weakly driven, so that the input voltage must debias the holding circuitry and bias the new driving circuitry in order to cause a transition. By always having this asymmetry so that the holding state is strong (and the new state is weakly driven), the input voltage must always traverse a greater voltage delta in order to effect a state change.

FIG. 4 illustrates a graph of current versus time showing an exemplary current expenditure for a standard prior art hysteresis circuit. FIG. 5 illustrates a graph of current versus time showing an exemplary current expenditure for an advantageous embodiment of the hysteresis circuit of the present invention. The current versus time graphs illustrated in FIG. 4 and in FIG. 5 were both run with the same input, voltages, models, and conditions.

As shown in FIG. 4, the current expenditure rises from a level of approximately zero microamperes (0.00 u) at seventy nanoseconds (70.0 nsec) to a maximum of approximately two hundred twenty microamperes (220.0 u) at approximately ninety four nanoseconds (94.0 nsec).

Compare this current expenditure with that of the present invention shown in FIG. 5. As shown in FIG. 5, the current expenditure rises from a level of approximately four microamperes (4.00 u) at fifty three nanoseconds (53.0 nsec) to a maximum of approximately thirty microamperes (30.0 u) at approximately fifty four and one half nanoseconds (54.5 nsec).

A comparison of the prior art current expenditure with the current expenditure of the present invention shows that the present invention uses almost ten (10) times less current than the prior art circuitry. The maximum current increase for the prior art is approximately two hundred twenty microamperes (220.0 u). The maximum current increase for the present invention is approximately twenty six microamperes (26.0 u). The value of twenty six microamperes (26.0 u) is obtained by subtracting four microamperes (4.0 u) from thirty microamperes (30.0 u).

Therefore the amount of current expenditure of the present invention is approximately one order of magnitude lower than the current expenditure of the prior art circuitry.

Although the present invention has been described with an exemplary embodiment, various changes and modifications may be suggested to one skilled in the art. It is intended that the present invention encompass such changes and modifications as fall within the scope of the appended claims.

What is claimed is:

1. A variable drive strength hysteresis input circuit comprising:
   pull-up circuitry having a pull-up drive strength;
   pull-down circuitry having a pull-down drive strength; and
   variable drive strength circuitry that is capable of changing at least one of: said pull-up drive strength of said pull-up circuitry and said pull-down drive strength of said pull-down circuitry;
   wherein the variable drive strength circuitry comprises a first inverter configuration and a second inverter configuration coupled in series, the first inverter configuration comprising a first p-channel transistor and a first n-channel transistor;
   wherein the pull-up circuitry comprises a second p-channel transistor and a third p-channel transistor coupled together in parallel with each other and in series with the first p-channel transistor;
   wherein the pull-down circuitry comprises a second n-channel transistor and a third n-channel transistor coupled together in parallel with each other and in series with the first n-channel transistor;
   wherein the second and third p-channel transistors have drains coupled to a source of the first p-channel transistor, and the second p-channel transistor has a gate coupled to the drains of the second and third p-channel transistors and to the source of the first p-channel transistor; and
   wherein the second and third n-channel transistors have drains coupled to a source of the first n-channel transistor and the second n-channel transistor has a gate coupled to the drains of the second and third n-channel transistors and to the source of the first n-channel transistor.

2. The variable drive strength hysteresis input circuit as set forth in claim 1 wherein said variable drive strength circuitry changes at least one of said pull-up drive strength of said pull-up circuitry and said pull-down drive strength of said pull-down circuitry in response to receiving an input voltage signal that transitions from low to high.

3. The variable drive strength hysteresis input circuit as set forth in claim 1 wherein said variable drive strength circuitry changes at least one of said pull-up drive strength of said pull-up circuitry and said pull-down drive strength of said pull-down circuitry in response to receiving an input voltage signal that transitions from high to low.

4. The variable drive strength hysteresis input circuit as set forth in claim 1 wherein said second inverter configuration comprises:
a fourth p-channel transistor and a fourth n-channel transistor.

5. The variable drive strength hysteresis input circuit as set forth in claim 4 wherein a gate of said first p-channel transistor and a gate of said first n-channel transistor of said first inverter configuration are coupled to an input voltage signal.

6. The variable drive strength hysteresis input circuit as set forth in claim 5 wherein a gate of said fourth p-channel transistor and a gate of said fourth n-channel transistor of said second inverter configuration are coupled to an output of said first inverter configuration.

7. The variable drive strength hysteresis input circuit as set forth in claim 6 wherein said second inverter configuration generates an output feedback signal that is equivalent to said input voltage signal.

8. The variable drive strength hysteresis input circuit as set forth in claim 7 wherein said output feedback signal from said second inverter configuration is coupled to a gate of said third p-channel transistor.

9. The variable drive strength hysteresis input circuit as set forth in claim 8 wherein said output feedback signal from said second inverter configuration turns off said third p-channel transistor when said input signal voltage transitions from a low level to a high level.

10. The variable drive strength hysteresis input circuit as set forth in claim 9 wherein said output feedback signal from said second inverter configuration is coupled to a gate of said third n-channel transistor.

11. The variable drive strength hysteresis input circuit as set forth in claim 10 wherein said output feedback signal from said second inverter configuration turns off said third n-channel transistor when said input signal voltage transitions from a high level to a low level.

12. The variable drive strength hysteresis input circuit as set forth in claim 11 wherein said output feedback signal from said second inverter configuration turns on said third p-channel transistor when said input signal voltage transitions from a high level to a low level.

13. The variable drive strength hysteresis input circuit as set forth in claim 10 wherein said output feedback signal from said second inverter configuration turns on said third n-channel transistor when said input signal voltage transitions from a low level to a high level.

14. A variable drive strength hysteresis input circuit comprising:
a first p-channel transistor and a first n-channel transistor coupled together in a first inverter configuration; and
a second p-channel transistor and a second n-channel transistor coupled together in a second inverter configuration;
wherein an input of said first inverter configuration is coupled to a source of an input signal voltage and wherein an input of said second inverter configuration is coupled to an output of said first inverter configurations;
wherein the first inverter configuration is coupled to pull-up circuitry comprising a third p-channel transistor and a fourth p-channel transistor coupled together in parallel with each other and in series with the first p-channel transistor;
wherein the first inverter configuration is coupled to pull-down circuitry comprising a third n-channel transistor and a fourth n-channel transistor coupled together in parallel with each other and in series with the first n-channel transistor;
wherein a source of the first p-channel transistor is coupled to drains of the third and fourth p-channel transistors and to a gate of the third p-channel transistor; and
wherein a source of the first n-channel transistor is coupled to drains of the third and fourth n-channel transistors and to a gate of the third n-channel transistor.

15. The variable drive strength hysteresis input circuit as set forth in claim 14 wherein the pull-up circuitry is coupled to an output of said second inverter configuration, and wherein said pull-up circuitry is controllable by an output feedback signal of said second inverter configuration.

16. The variable drive strength hysteresis input circuit as set forth in claim 14 wherein the pull-down circuitry is coupled to an output of said second inverter configuration and wherein said pull-down circuitry is controllable by an output feedback signal of said second inverter configuration.

17. The variable drive strength hysteresis input circuit as set forth in claim 15 wherein said output feedback signal of said second inverter configuration turns off said pull-up circuitry when the input signal voltage transitions from a low level to a high level.

18. The variable drive strength hysteresis input circuit as set forth in claim 16 wherein said output feedback signal of said second inverter configuration turns off said pull-down circuitry when the input signal voltage transitions from a high level to a low level.

19. The variable drive strength hysteresis input circuit of claim 1, wherein a current expenditure in the variable drive strength hysteresis input circuit does not exceed approximately thirty microamperes.

\* \* \* \* \*